(12) United States Patent
Villa et al.

(10) Patent No.: US 7,678,600 B2
(45) Date of Patent: Mar. 16, 2010

(54) PROCESS FOR MANUFACTURING A MEMBRANE OF SEMICONDUCTOR MATERIAL INTEGRATED IN, AND ELECTRICALLY INSULATED FROM, A SUBSTRATE

(75) Inventors: Flavio Francesco Villa, Milan (IT); Pietro Corona, Milan (IT); Chantal Combi, Oggiono (IT); Lorenzo Baldo, Bareggio (IT); Gabriele Barlocchi, Cornaredo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 170 days.

(21) Appl. No.: 12/047,830

(22) Filed: Mar. 13, 2008

(65) Prior Publication Data

US 2008/0224242 A1    Sep. 18, 2008

(30) Foreign Application Priority Data

Mar. 14, 2007    (IT)    ........................... TO2007A0190

(51) Int. Cl.
*H01L 21/00*    (2006.01)
(52) U.S. Cl. .................... 438/48; 257/415; 257/419; 257/E29.324
(58) Field of Classification Search ........................ None
See application file for complete search history.

(56) References Cited

U.S. PATENT DOCUMENTS 5,883,420 A * 3/1999 Mirza et al. .................. 257/419

FOREIGN PATENT DOCUMENTS

EP    1 324 382    7/2003
EP    1 577 656    9/2005

OTHER PUBLICATIONS

Sato, T. et al., "A New Substrate Engineering for the Formation of Empty Space in Silicon (EES) Induced by Silicon Surface Migration," IEDM: 517-520, 1999.

* cited by examiner

*Primary Examiner*—W. David Coleman
*Assistant Examiner*—Shaka Scarlett
(74) *Attorney, Agent, or Firm*—Lisa K. Jorgenson; E. Russell Tarleton; Seed IP Law Group PLLC

(57) ABSTRACT

A process for manufacturing an integrated membrane made of semiconductor material includes the step of forming, in a monolithic body of semiconductor material having a front face, a buried cavity, extending at a distance from the front face and delimiting with the front face a surface region of the monolithic body, the surface region forming a membrane that is suspended above the buried cavity. The process further envisages the step of forming an insulation structure in a surface portion of the monolithic body to electrically insulate the membrane from the monolithic body; and the further and distinct step of setting the insulation structure at a distance from the membrane so that it will be positioned outside the membrane at a non-zero distance of separation.

30 Claims, 4 Drawing Sheets

PROCESS FOR MANUFACTURING A MEMBRANE OF SEMICONDUCTOR MATERIAL INTEGRATED IN, AND ELECTRICALLY INSULATED FROM, A SUBSTRATE

BACKGROUND

1. Technical Field

The present disclosure relates to a process for manufacturing a membrane made of semiconductor material that is integrated in, and electrically insulated from, a substrate.

2. Description of the Related Art

A large number of integrated semiconductor sensors are known, made with micromachining techniques, which base their operation on detection of a deformation of a thin membrane (also defined as diaphragm), suspended above a cavity. Among these sensors it is possible, for example, to mention absolute or differential, capacitive or piezoresistive, pressure sensors, inertial sensors, chemical sensors, magnetic-field sensors, and microphones. It is also known that it is often advantageous, or even necessary, to provide an electrical, and possibly thermal, insulation of the membrane.

Main known techniques for manufacturing electrically insulated membranes envisage the use of a SOI (Silicon On Insulator) wafer, or of surface micromachining techniques, with selective removal of sacrificial layers (e.g., a field-oxide or buried-oxide layer). According to these techniques, a substrate of semiconductor material is used only as a mechanical support.

The aforesaid techniques are in general complex to implement and involve considerable manufacturing costs.

European patent application No. EP-A-1 577 656, filed in the name of the present applicant, discloses a process for the manufacturing of a membrane of monocrystalline silicon suspended above a cavity, buried and entirely contained within a substrate, which is also made of silicon. This process is extremely simple and economically advantageous, and compatible with the integrated manufacturing of corresponding electronic circuits; also, the resulting structure has small dimensions.

However, the problem of electrical or thermal insulation of the membrane thus obtained has not yet been adequately solved, so that this manufacturing process is not currently completely exploitable in applications in which the insulation of the membrane from the substrate from which it is obtained is required. In particular, it is advisable to prevent structures for electrical insulation of said membrane from altering the mechanical behavior thereof, in particular the capacity of deformation due to external stresses, and from causing in general reliability problems.

BRIEF SUMMARY

The present disclosure is directed to a process for manufacturing an electrically insulated membrane of semiconductor material that will enable the aforesaid disadvantages and problems to be overcome.

In accordance with one embodiment of the present disclosure, a process for manufacturing an insulating membrane made of semiconductor material is provided, the process including forming, in a monolithic body of semiconductor material having a front face, a buried cavity extending at a distance from said front face and delimiting with said front face a surface region of said monolithic body, said surface region forming a membrane that is suspended above said buried cavity; forming an insulation structure in a surface portion of said monolithic body such as to electrically insulate said membrane from said monolithic body; and setting said insulation structure at a distance from said membrane so that said insulation structure is positioned outside, and at a non-zero distance of separation from said membrane.

In accordance with another embodiment of the present disclosure, a microelectromechanical structure is provided that includes a monolithic body of semiconductor material having a front face; and a buried cavity, extending at a distance from said front face and delimiting with said front face a membrane, which is suspended above said buried cavity; and an insulation structure in a surface portion of said monolithic body, surrounding said membrane at a non-zero distance of separation and configured to electrically insulate said membrane from said monolithic body.

In accordance with another embodiment of the present disclosure, a process is provided that includes forming at least two voids in a substrate and a membrane formed from the substrate material to completely cover at least one of the at least two voids; forming a trench completely around the membrane at a non-zero distance from the membrane and extending into the substrate to a depth that is at least a depth of at least one of the at least two voids in the substrate and in communication with at least one of the at least two voids; and forming a buried insulation region completely around the trench and all of the at least two voids via the trench to electrically insulate the membrane from a remainder of the substrate.

In accordance with another aspect of the foregoing embodiment, the process includes filling the trench and all but one of the at least two voids with a dielectric material to form a single uniform electrical and thermal insulation structure around the membrane while leaving a remaining void below the membrane to provide functionality to the membrane.

In accordance with another aspect of the foregoing embodiment, the process of forming at least two voids and the membrane includes forming at least one buried cavity and at least one buried channel and filling all but one of the at least one buried cavity and all of the buried channels with the dielectric material via the trench.

In accordance with another aspect of the foregoing embodiment, the trench is filled with the dielectric material.

In accordance with another aspect of the foregoing embodiment, the process includes etching the substrate to form a plurality of columns and performing epitaxial growth on the columns to merge a top portion of the columns to form the membrane of monocrystalline silicon that is flexible and adapted to flex above one of the at least two voids in the presence of external stress.

In accordance with another aspect of the foregoing embodiment, the trench is formed away from the membrane and anchorages of the membrane to the substrate a distance of separation to prevent mechanical stresses on the membrane due to discontinuity represented by a silicon-oxide junction created by the insulation structure.

BRIEF DESCRIPTION OF THE SEVERAL VIEWS OF THE DRAWINGS

For a better understanding of the present disclosure, preferred embodiments thereof are now described, purely by way of non-limiting example and with reference to the attached plate of drawings, wherein.

DETAILED DESCRIPTION

Embodiments of a process for manufacturing a suspended membrane of semiconductor material are now described. This process is based, in part, on the processes disclosed in the aforesaid European patent application No. EP-A-1 577 656, and in the European patent application No. EP-A-1 324 382, which is also filed in the name of the present applicant.

Figure 1:
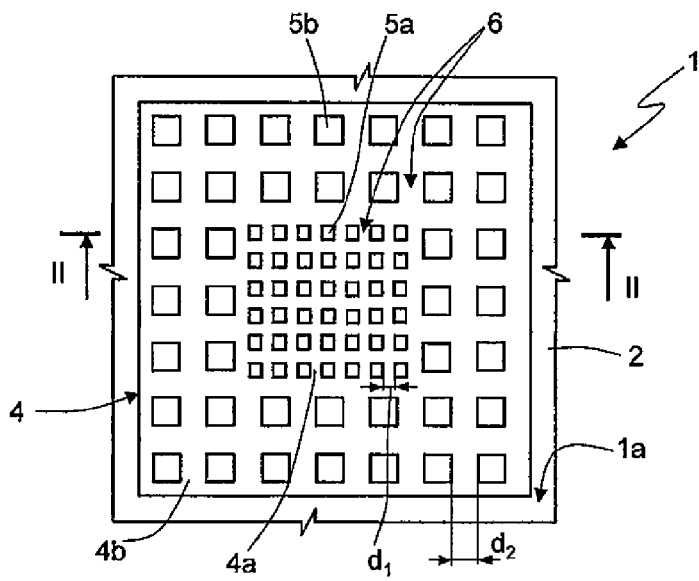
FIG. 1 shows a top plan view of a wafer of semiconductor material in an initial step of a process for manufacturing a membrane according to a first embodiment of the present disclosure.
Figure 2:
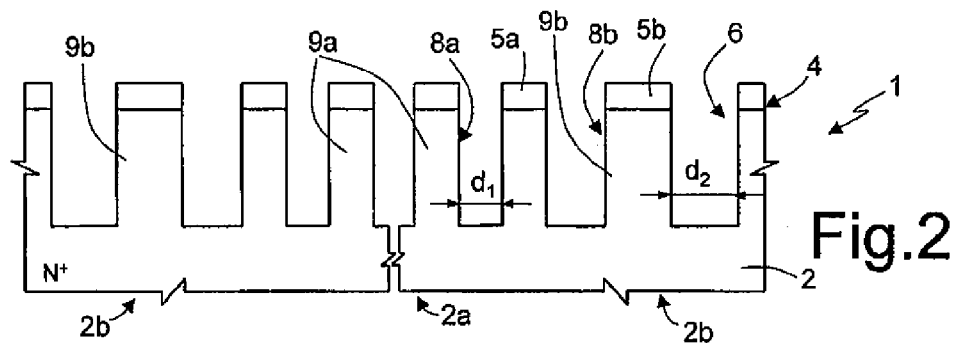
FIGS. 2-4 show cross sections taken along the line II-II of the wafer of FIG. 1 in subsequent steps of the manufacturing process.

FIG. 1 (not in scale, as neither are the subsequent figures) shows a wafer 1 of semiconductor material, for example monocrystalline silicon, that includes a substrate 2, for example of an $N^+$ type (such as to provide an electrical path with low resistance). In an initial step of the manufacturing process, a resist layer is deposited on a top surface 1a of the wafer 1; the resist layer is then defined so as to form a mask 4 (see also the cross-sectional view of FIG. 2). In detail, the mask 4 includes a first mask region 4a, extending, for example, over an approximately square inner area, and a second mask region 4b, adjacent to, and extending as a frame around, the first mask region 4a, surrounding it entirely. The first and second mask regions 4a, 4b are made of a plurality of respective mask portions 5a, 5b having a generic polygonal shape (for example a square shape), arranged in a regular manner in rows and columns and defining together a grid-shaped mask opening 6. In particular, the mask portions 5a of the first mask region 4a are set at a first separation distance d1, whilst the mask portions 5b of the second mask region 4b are set at a second separation distance d2, greater than the first separation distance d1. In addition, the mask portions 5b of the second mask region 4b have dimensions greater than the mask portions 5a of the first mask region 4a. For example, the first separation distance d1 (equal to the side of the first mask portions 5a) is in the range of 0.5 and 1 μm, whilst the second separation distance d2 (equal to the side of the second mask portions 5b) is in the range of 1 and 2 μm.

Using the mask 4 (FIG. 2), an anisotropic chemical etching of the front of the wafer 1 is carried out, forming first and second deep trenches 8a, 8b in positions corresponding to the mask opening 6, respectively of the first mask region 4a and the second mask region 4b. The deep trenches 8a, 8b, having for example a depth of 10 μm, delimit silicon columns, with a section corresponding to the mask portions 5a, 5b. In particular, first columns (or pillars) 9a are formed in a first region 2a of the substrate 2 underneath the first mask region 4a, and second columns 9b in a second region 2b of the substrate 2, surrounding like a frame the first region 2a, underneath the second mask region 4b. The first columns 9a are also consequently set at the first separation distance d1, and the second columns 9b at the second separation distance d2, and moreover the second columns 9b have in cross-section larger dimensions than the first columns 9a. The deep trenches 8a, 8b communicate with one another and form, together, a labyrinthine region of complex shape, with a section corresponding to the grid of the mask opening 6.

Figure 3:
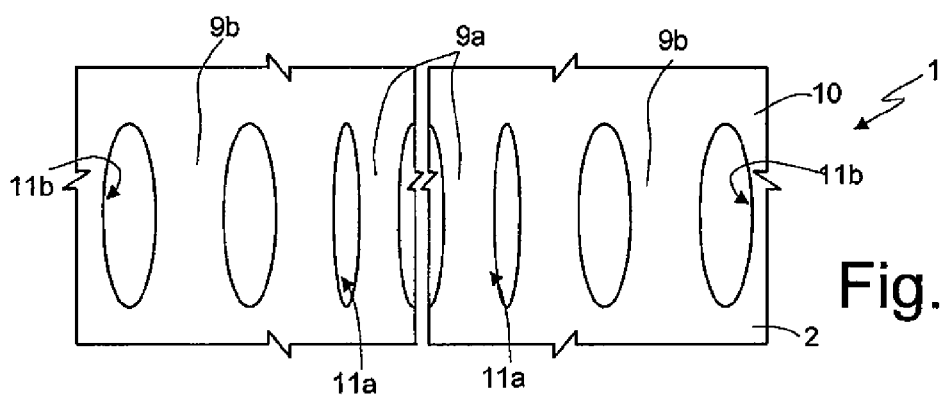

Next, the mask 4 is removed, and an epitaxial growth is performed in a deoxidizing environment (typically, in an atmosphere with a high concentration of hydrogen, preferably with trichlorosilane-$SiHCl_3$). Consequently (FIG. 3), an epitaxial layer 10 of monocrystalline silicon grows in a controlled way on top of the columns 9a, 9b and closes the aforesaid labyrinthine region at the top, trapping the gas present therein. In particular, before the deep trenches 8a, 8b are closed at the top, a growth of silicon occurs also inside them, which causes a reduction of their dimensions. At the end of the epitaxial growth step, the first and second deep trenches 8a, 8b form respective first and second buried channels 11a, 11b having an oval and elongated cross section in a direction perpendicular to the top surface 1a of the wafer 1.

A step of thermal annealing is then performed, preferably in a hydrogen atmosphere for 30 minutes at 1190° C., or, alternatively, in a nitrogen atmosphere or an atmosphere of another inert gas (for example, argon), or else of a combination of hydrogen and of another inert gas. As discussed in the aforementioned patent applications (and as described in detail, for example, in "A New Substrate Engineering for the Formation of Empty Space in Silicon (ESS) Induced by Silicon Surface Migration" T. Sato, N. Aoki, I. Mizushima, and Y. Tsunashima, IEDM 1999, pp. 517-520), the annealing step causes a migration of the silicon atoms, which tend to move into a position of lower surface energy, through adjacent lattice positions and preserving intact the perfect crystal-lattice structure of silicon.

Figure 4:
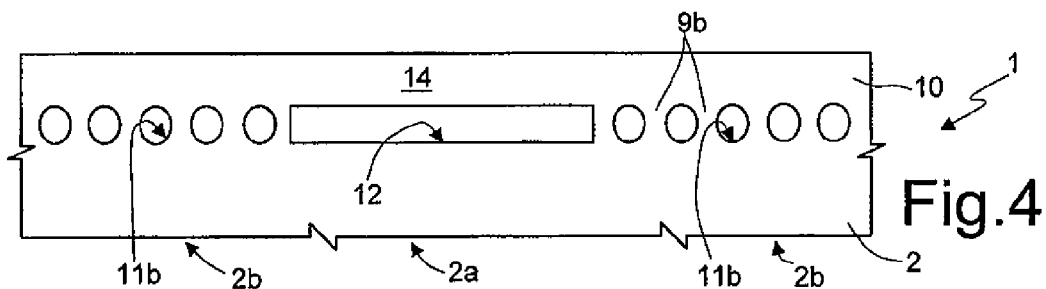

In particular (FIG. 4), on account of the small separation distance between the first columns 9a and their small width, the first buried channels 11a within the first region 2a of the substrate 2 merge completely (or in a similar way, the silicon atoms migrate completely from the first columns 9a), and consequently a single buried cavity 12 is formed, having, for example, a square cross section of a side of 500 μm and a thickness of 0.5 μm, closed and totally insulated within the substrate 2. Above the buried cavity 12 there remains a thin layer of silicon, having for example a thickness of approximately 5-10 μm, constituted in part by silicon atoms grown epitaxially and in part by silicon atoms that have migrated from the first columns 9a. There is thus formed a membrane 14 of monocrystalline silicon, which is flexible, is suspended above the buried cavity 12, and can deflect in the presence of external stresses. Instead, given the greater separation distance between the second columns 9b in the second region 2b of the substrate 2, the silicon atoms do not migrate completely from the second columns 9b, which thin out during the annealing process, but do not disappear. The second buried channels 11b, which tend to move into a lower energy condition, assume an approximately circular cross section, without merging with one another.

Figure 5:
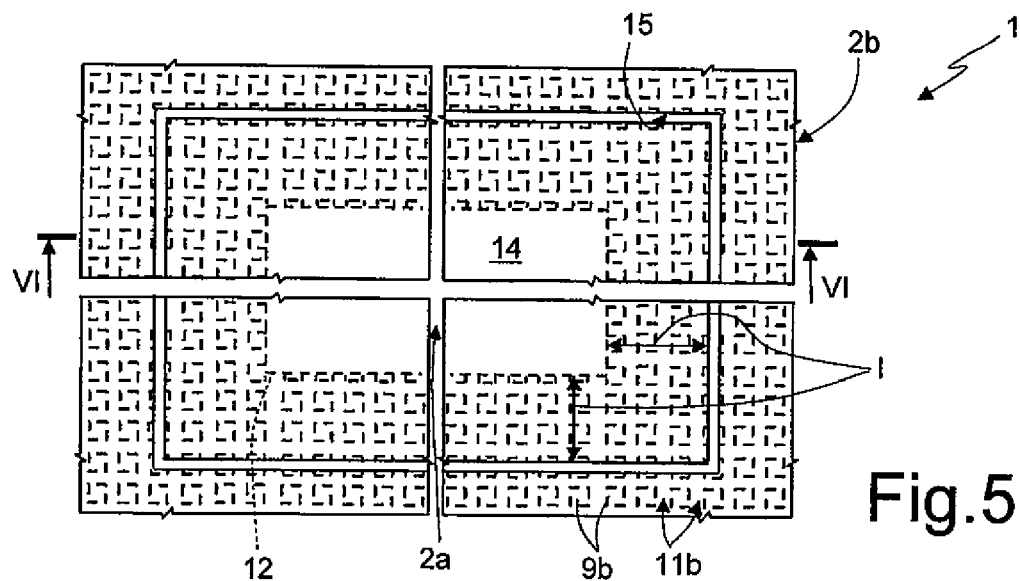
FIG. 5 shows a top plan view of the wafer of FIG. 4 in a subsequent step of the manufacturing process.

Next (FIG. 5), the wafer 1 is etched from the front to form a connection trench 15, extending vertically (in a direction transverse to the top surface 1a) and having a depth and a dimension such as to reach the second buried channels 11b. The connection trench 15 extends along a closed line within the second region 2b of the substrate 2, externally with respect to the buried cavity 12 and to the membrane 14, in particular at a given distance of separation I from the membrane 14, comprised between 1 and 100 μm, preferably between 1 and 50 μm. In particular, portions of the connection trench 15 extend at the distance of separation I on corresponding sides of the membrane 14.

Figure 6:
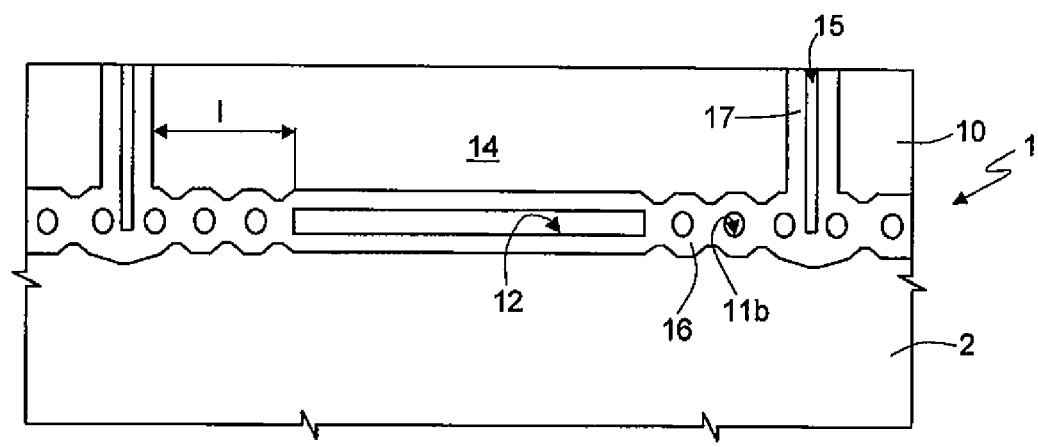
FIGS. 6 and 7 show cross sections taken along the line VI-VI of the wafer of FIG. 5 in conclusive steps of the manufacturing process.

Oxygen is then supplied through the connection trench 15 during a thermal oxidation step (FIG. 6) so as to oxidize completely the second columns 9b, the portions of silicon surrounding the second buried channels 11b and the buried cavity 12, and partially the internal walls of the connection trench 15. A buried insulation region 16 is thus formed, which separates the membrane 14 electrically from the substrate 2 in a direction transverse to the top surface 1a, and also a vertical insulation region 17, which separates the membrane 14 electrically from the substrate 2 in a direction parallel to the top surface 1a.

Next, a layer of dielectric material, for example TEOS (tetraethyl orthosilicate) oxide can be deposited on the wafer 1 so as to fill the opening to the connection trench 15 completely (FIG. 7) with an insulating filling region 18. Possibly, the dielectric material can fill also the second buried channels 11b (either completely or partially), and form with the buried insulating region 16 a single uniform and compact electrical insulation structure. Within this insulation structure voids may remain, without, however, this altering its properties of electrical insulation. Furthermore, the substantial continuity of the buried insulation region 16 and of the vertical insulation region 17 ensures electrical and thermal insulation of the membrane 14 from the substrate 2.

It is to be noted in particular that the vertical insulation region 17 is advantageously made at a distance from, and outside of, the membrane 14 so as to prevent reliability problems. In fact, at the discontinuity represented by the silicon-oxide junction due to the aforesaid insulation region, the mechanical stresses, which could cause damage to, or even failure of, the microelectromechanical structure, are maximum. The location of the insulation region far from the membrane 14 and from its anchorages to the substrate 2 enables prevention of the aforesaid reliability problems.

The layer of dielectric material can then be removed from the surface of the wafer, and further surface insulation structures (for example, of a LOCOS type) can be formed. In any case, a thin passivation layer 19 is deposited on the top surface 1a of the membrane 14.

Figure 7:
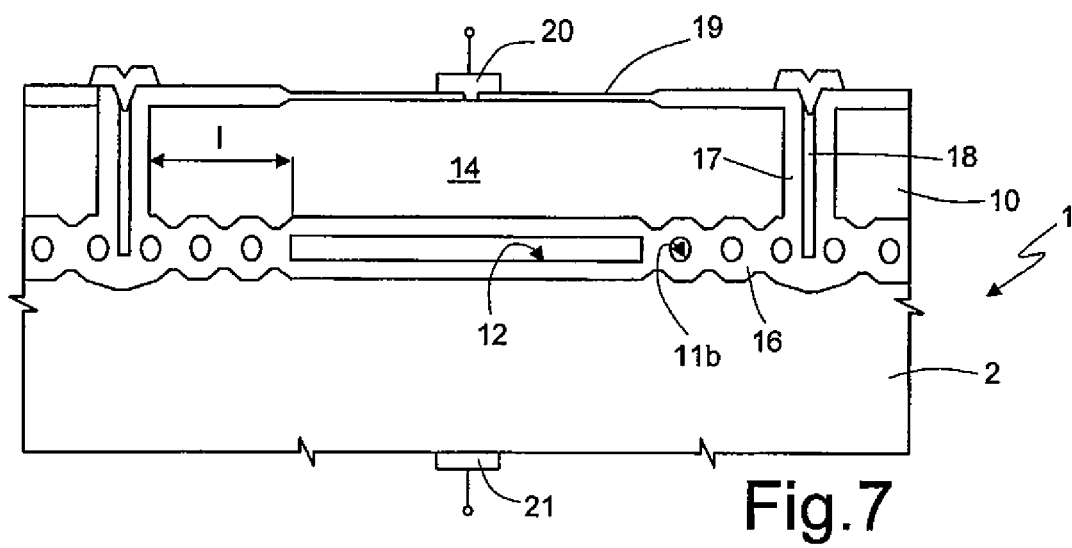

The manufacturing process then envisages formation of a first metal contact 20 and of a second metal contact 21, for electrically contacting the membrane 14 and the substrate 2, respectively. In detail, and as illustrated in FIG. 7, the first metal contact 20 is set on the membrane 14 at a central portion thereof, and the second metal contact 21 is set on the back of the wafer 1. Alternatively (in a way not illustrated), the first metal contact 20 can be arranged as a circular ring in a position external to the membrane 14 but inside the vertical insulation region 17, and the second metal contact 21 can be set also on the front of the wafer, outside the vertical insulation region 17. The area external to the insulation structure can house a reading/control electronics, for example made with BCD processes with junction insulation ("top-bottom"), or with oxide insulation.

It is thus possible to obtain a capacitive pressure sensor in which the first and second metal contacts 20, 21 contact the plates of a detection capacitor, the value of capacitance of which varies with deformation of the membrane 14 (in turn caused by a pressure acting on its external surface). In a per-se known manner (which is not described in detail), further electrical components can be integrated within the membrane 14 with appropriate integration masks; for example, piezoresistive elements can be integrated to obtain a pressure piezoresistive sensor.

A second embodiment of the present disclosure envisages a different process for formation of the vertical insulation region; also in this case, process steps are carried out such that this region is set outside the membrane 14, at a certain distance of separation I, so as to prevent any mechanical stresses therein.

Figure 8:
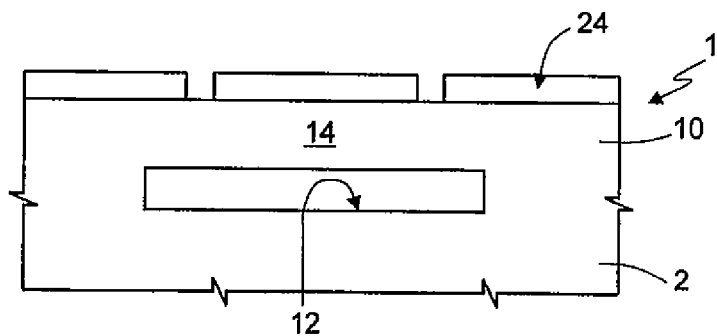
FIG. 8 shows a cross section of a wafer of semiconductor material in a manufacturing process in accordance with a second embodiment of the disclosure.

In detail, the process envisages (FIG. 8) formation of the buried cavity 12 within the substrate 2 and the membrane 14, as described previously. It is to be noted that, in this case, the buried insulation region is not formed at the side of the cavity 12 (basically, just the first mask region 4a is used for formation of the first columns 9a at the first separation distance d1). On the top surface 1a of the wafer a resist layer is then formed, which is appropriately defined so as to form an etching mask 24.

Figure 9A:
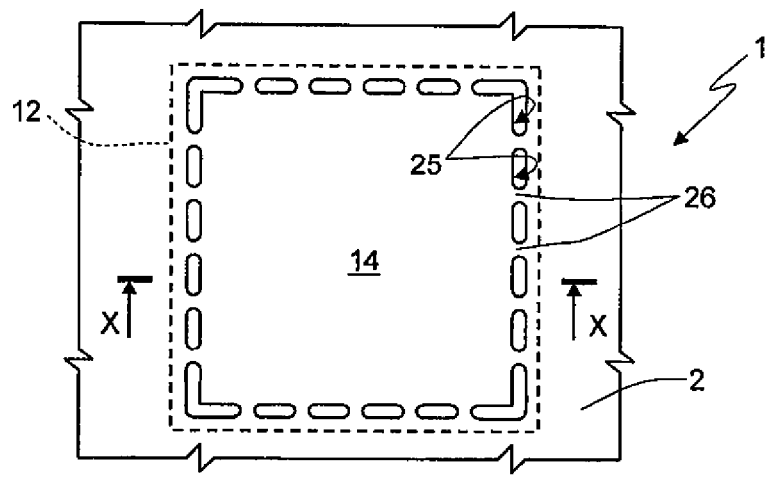
FIGS. 9a-9c show top plan views of the wafer of FIG. 8 in a subsequent step of the manufacturing process, according to different variants.
Figure 9B:
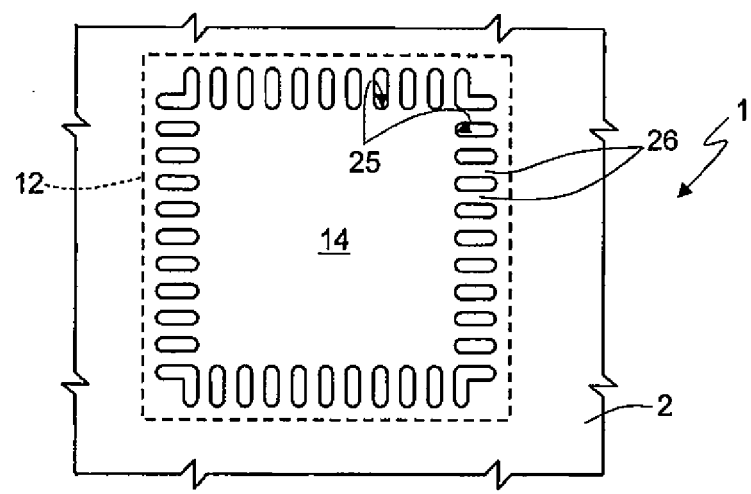
Figure 9C:
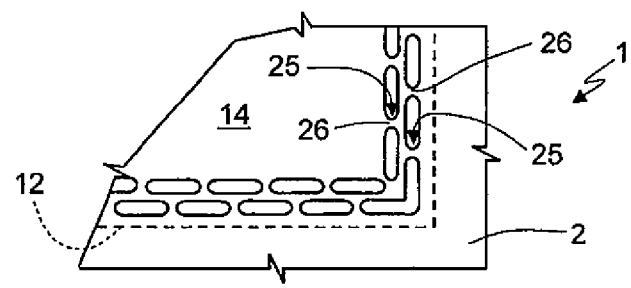

Next (FIGS. 9a-9c), through the etching mask 24, an external peripheral portion of the membrane 14 is etched, and a plurality of trenches 25 are opened, each of which extends through the membrane 14 and has a depth such as to reach the buried cavity 12. In detail, in the variant illustrated in FIG. 9a, the trenches 25 are aligned at regular intervals parallel to external sides of the membrane 14, throughout the perimeter of the membrane. Each trench 25 extends parallel to a respective external side of the membrane 14. Suspension bridges 26 are present between adjacent and consecutive trenches 25; suspension bridges 26 are made of silicon, connect the membrane 14 to the substrate 2, and have the function of supporting the membrane above the buried cavity 12, during the etching step. In the variant of FIG. 9b, the trenches 25 are again set at a regular distance along the external sides of the membrane 14, but each trench 25 extends in a direction transverse to a respective one of the external sides. The variant illustrated in FIG. 9c envisages, instead, the presence of two series of trenches 25, set inside one another, each series being formed by aligned trenches extending parallel to the external sides of the membrane 14 (in a similar way to what is illustrated in FIG. 9a).

Figure 10:
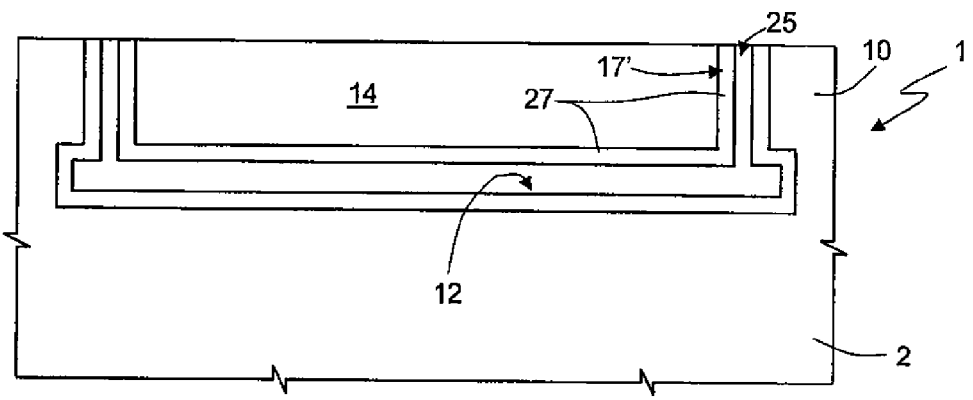
FIGS. 10 and 11 show cross sections taken along the line X-X of the wafer of FIG. 9a in conclusive steps of the manufacturing process.
Figure 11:
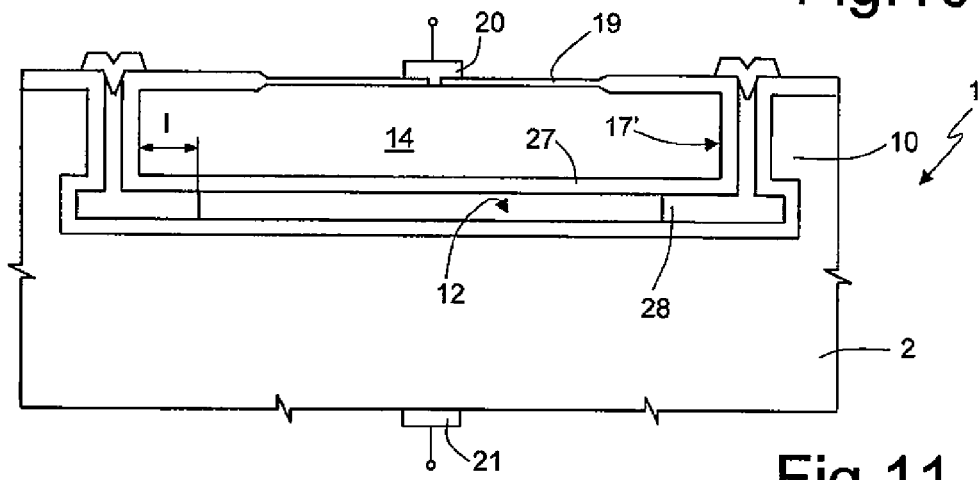

Next (FIG. 10), a thermal oxidation of the trenches 25 is performed, which leads to formation of an oxide layer 27 on the internal walls of the trenches 25 and of the buried cavity 12, and to complete oxidation of the suspension bridges 26. A vertical insulation region is thus formed, now designated by 17', which surrounds the membrane 14 completely, insulating it electrically and thermally from the substrate 2.

Next, a filling region 28, for example of polysilicon, is introduced within the trenches 25, for example using the CVD technique; the filling region 28 fills the trenches totally, and it also fills an external peripheral portion of the buried cavity 12, consequently reducing the dimensions thereof. Accordingly, the dimensions of the membrane 14, suspended above the buried cavity 12, are also reduced. Advantageously, the filling region 28 penetrates within the buried cavity 12 for a distance of approximately 1-50 μm. Introduction of the filling region 28 thus again enables mechanical decoupling of the membrane 14 from the vertical insulation region 17', which in fact occupies a position at a certain distance of separation I from the membrane. In this way, stressing of the silicon-oxide discontinuity caused by deformation of the membrane is prevented. In this second embodiment, the resulting dimensions of the membrane 14 depend on the amount of polysilicon introduced, and hence on the extent of introduction of the filling region 28 within the buried cavity 12.

Figure 12:
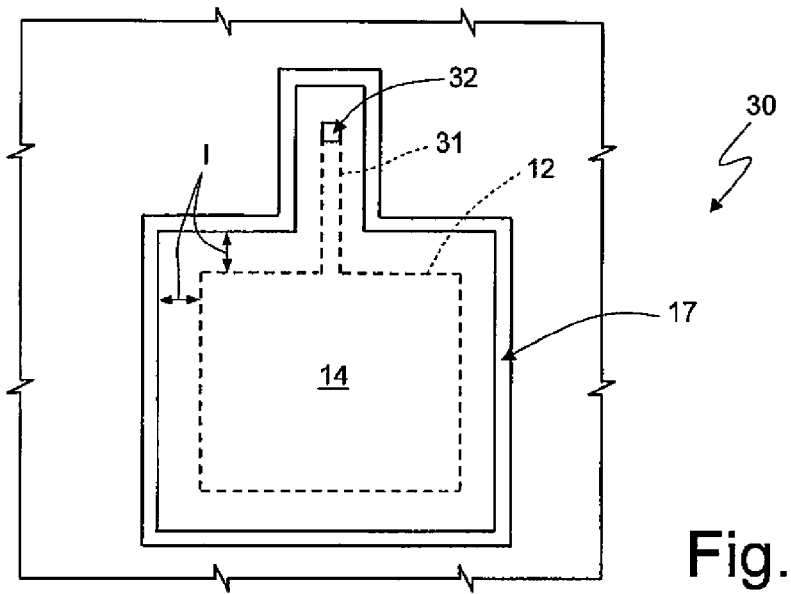
FIG. 12 shows a top plan view of the wafer of semiconductor material at the end of the manufacturing process according to a further embodiment of the present disclosure.

According to a further embodiment of the present disclosure, the process described can be modified to obtain a differential pressure sensor 30, illustrated schematically in FIG. 12.

In detail, simultaneously with formation of the buried cavity 12, a connection channel 31 is formed, buried within the substrate 2, in a lateral position with respect to the buried cavity 12 and in fluid communication therewith. For this purpose, process steps are performed that are substantially similar to the ones previously described (and for this reason are not described again), but starting from a first mask region 4a that laterally has a rectangular projection of a shape corresponding to the one desired for the connection channel 31.

During the final steps of the manufacturing process, after formation of the vertical insulation region 17 (or 17'), which in this case extends also around the connection channel 31, an access trench 32 is dug by digging from the front of the wafer 1; this trench traverses a surface portion of the substrate and reaches the connection channel 31. Digging to form the access trench 32 can also be performed from the back of the substrate 2, with the disadvantage, however, of traversing a greater thickness of silicon. Through the access trench 32 and the connection channel 31, it is possible to gain access to an internal wall of the buried cavity 12. This enables detection of differential pressure in the case where a pressure is exerted both on the internal face and on the external face of the membrane 14.

The foregoing may be applied both to the first and to the second embodiment described previously. In the case where the buried insulation region 16 is present, the second mask region 9b has a conformation such as to surround, in contact, the first mask region 9a (which also has a lateral projection in a position corresponding to the connection channel 31).

The process described affords numerous advantages. In particular, it enables in a simple and inexpensive way a membrane of monocrystalline silicon to be obtained, integrated in a silicon substrate, suspended above a buried cavity, electrically and thermally insulated from the substrate from which it has been obtained. In particular, vertical insulation regions are made far from the membrane and from its anchorages, separated by a distance sufficient to prevent mechanical stresses and the consequent risk of damage or failure.

The process does not envisage the use of SOI wafers or of complex techniques of surface micromachining, is extremely versatile and robust, easy to control, and of low cost.

The resulting structures (for example, the pressure sensor described) have small dimensions and are consequently suited for very small packages, for example LGA packages, which are compatible with "wafer-level" package techniques. Piezoresistive structures and/or structures sensitive to particular chemical compounds can moreover be easily integrated in the membrane.

Finally, it is clear that modifications and variations can be made to what is described and illustrated herein, without thereby departing from the scope of the present disclosure, as defined in the annexed claims.

In particular, in the first embodiment, the buried insulation region 16 can be confined to just the sensor (hence surrounding only the membrane 14), or else can extend throughout a silicon die, as far as the scribing lines in which cutting of the wafer 1 is performed.

Furthermore, the structure of the mask 4 and the shape of the deep trenches 8a, 8b and of the columns 9a, 9b can vary with respect to what is illustrated herein. For example, the mask 4 can have a structure complimentary to the one described previously, and consequently including a grid-shaped structure defining a plurality of openings of a polygonal shape, or else the same mask can be shaped like a grating to define openings having a striplike shape. The same columns 9a, 9b can also have a different shape (for example, with hexagonal cross section).

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A process for manufacturing an insulated membrane made of semiconductor material, comprising:
    forming, in a monolithic body of semiconductor material having a front face, a buried cavity extending at a distance from said front face and delimiting with said front face a surface region of said monolithic body, said surface region forming a membrane that is suspended above said buried cavity;
    forming an insulation structure in a surface portion of said monolithic body such as to electrically insulate said membrane from said monolithic body; and
    setting said insulation structure at a distance from said membrane so that said insulation structure is positioned outside, and at a non-zero distance of separation from said membrane.

2. The process according to claim 1, wherein said membrane is continuous and formed by a single portion of semiconductor material, and said buried cavity is contained and completely insulated within said monolithic body.

3. The process according to claim 1, wherein said distance of separation, measured in a plane parallel to said front face, is comprised between 1 and 100 μm, preferably between 1 and 50 μm.

4. The process according to claim 1, wherein said step of setting at a distance comprises forming in said monolithic body a connecting structure, made of insulating material, adjacent to, and surrounding entirely, said buried cavity, subsequent to said step of forming said buried cavity; and said step of forming an insulation structure comprises forming said insulation structure outside, and surrounding, said membrane, and extending vertically starting from said front face as far as said connecting structure, joining therewith.

5. The process according to claim 4, wherein said step of forming said connecting structure is carried out substantially while said step of forming said insulation structure is carried out.

6. The process according to claim 4, wherein said connecting structure extends up to scribing lines of said monolithic body.

7. The process according to claim 4, wherein said step of forming a buried cavity comprises:

forming first buried channels within a first region of said monolithic body, said buried channels delimiting first separation structures made of semiconductor material; and carrying out a thermal treatment such as to cause migration of the semiconductor material of said first separation structures towards said front face, the elimination of said first separation structures, and the transformation of said first buried channels into said buried cavity;

and wherein said step of forming a connecting structure comprises:

forming second buried channels within a second region of said monolithic body adjacent to, and surrounding, said first region, delimiting second separation structures made of semiconductor material, said second separation structures having greater dimensions, and/or being set at a greater distance apart, with respect to said first separation structures, said thermal treatment consequently causing thinning-out of said second separation structures; and oxidizing completely said second separation structures.

8. The process according to claim 7, wherein said step of oxidizing completely further comprises oxidizing internal walls of said buried cavity and of said second buried channels.

9. The process according to claim 7, wherein said steps of forming first and second buried channels comprise:

digging first and second deep trenches within said first and second regions, respectively, of said monolithic body, delimiting said first and second separation structures, respectively; and performing an epitaxial growth so as to close at the top said first and second deep trenches with a closing layer made of semiconductor material, and wherein said step of forming said insulation structure comprises:

digging a vertical trench through said closing layer, such as to reach said second buried channels; and introducing oxygen through said vertical trench so as to form an insulating coating on internal walls of said vertical trench, said step of introducing oxygen also causing said step of oxidizing completely said second separation structures.

10. The process according to claim 9, wherein forming said insulation structure further comprises, after said step of oxidizing, forming within said vertical trench an insulating filling region so as to fill said trench completely.

11. The process according to claim 1, wherein said step of forming said insulation structure comprises forming said insulation structure inside said membrane, at an external portion and along an entire perimeter thereof, extending from said front face as far as said buried cavity; and wherein said step of setting at a distance comprises introducing, through said insulation structure, within a peripheral portion of said buried cavity, a filling material, so as to fill said peripheral portion and confine said membrane above a portion of said buried cavity inside said peripheral portion.

12. The process according to claim 11, wherein said filling material is polysilicon.

13. The process according to claim 11, wherein said step of forming an insulation structure comprises:

forming in said external portion of said membrane a plurality of access trenches, separated from one another by connection elements made of semiconductor material connecting said membrane to a substrate of said monolithic body; and oxidizing completely said connection elements and internal walls of said access trenches, wherein said step of setting at a distance comprising introducing said filling material through said access trenches.

14. The process according to claim 13, wherein said access trenches are aligned along external sides of said membrane and extend parallel to, and set in one or two rows alongside one another, or else in a direction transverse to, said external sides.

15. The process according to claim 1, further comprising:

forming a buried connection channel laterally with respect to, and in fluid connection with, said buried cavity; and forming a duct for access to said buried connection channel starting from an external face of said monolithic body, said insulation structure also surrounding said buried connection channel.

16. A microelectromechanical structure, comprising:

a monolithic body of semiconductor material having a front face; and a buried cavity, extending at a distance from said front face and delimiting with said front face a membrane, which is suspended above said buried cavity; and an insulation structure in a surface portion of said monolithic body, surrounding said membrane at a non-zero distance of separation and configured to electrically insulate said membrane from said monolithic body.

17. The microelectromechanical structure according to claim 16, wherein said membrane is continuous and formed by a single portion of semiconductor material, and said buried cavity is completely contained within said monolithic body.

18. The microelectromechanical structure according to claim 16, wherein said distance of separation, measured in a plane parallel to said front face, is in the range of 1 and 100 µm, preferably in the range of 1 and 50 µm.

19. The microelectromechanical structure according to claim 16, further comprising a connecting structure, made of insulating material, adjacent to, and surrounding entirely, said buried cavity; said insulation structure extending vertically starting from said front face as far as said connecting structure, joining therewith.

20. The microelectromechanical structure according to claim 19, wherein said insulation structure comprises a coating of insulating material and, within said coating, a filling material; said filling material delimiting said buried cavity.

21. The microelectromechanical structure according to claim 20, wherein said filling material is polysilicon.

22. The microelectromechanical structure according to claim 16, further comprising:

a buried connection channel set laterally with respect to, and in fluid connection with, said buried cavity; and an access duct for access to said buried connection channel, extending from said front face of said monolithic body; said insulation structure also surrounding said buried connection channel.

23. A sensor device comprising a microelectromechanical structure according to claim 16.

24. The device according to claim 23, comprising one from among: an absolute or differential pressure sensor, an inertial sensor, a chemical sensor, a magnetic-field sensor, and a microphone.

25. A process, comprising:

forming at least two voids in a substrate and a membrane formed from the substrate material to completely cover at least one of the at least two voids;

forming a trench completely around the membrane at a non-zero distance from the membrane and extending into the substrate to a depth that is at least a depth of at least one of the at least two voids in the substrate and in communication with at least one of the at least two voids; and forming a buried insulation region completely around the trench and all of the at least two voids via the trench to electrically insulate the membrane from a remainder of the substrate.

26. The process of claim 25, further comprising filling the trench and all but one of the at least two voids with a dielectric material to form a single uniform electrical and thermal insulation structure around the membrane while leaving a remaining void below the membrane to provide functionality to the membrane.

27. The process of claim 26, wherein forming at least two voids and a membrane comprises forming at least one buried cavity and at least one buried channel and filling all but one of the at least one buried cavity and all of the buried channels with the dielectric material via the trench.

28. The process of claim 27, wherein the trench is filled with the dielectric material.

29. The process of claim 25, wherein forming the membrane and the at least two voids comprises etching the substrate to form a plurality of columns and performing epitaxial growth on the columns to merge a top portion of the columns to form the membrane of monocrystalline silicon that is flexible and adapted to flex above one of the at least two voids in the presence of external stress.

30. The process of claim 25, wherein the trench is formed away from the membrane and anchorages of the membrane to the substrate a distance of separation to prevent mechanical stresses on the membrane due to discontinuity represented by a silicon-oxide junction created by the insulation structure.

* * * * *